US009270007B2

(12) United States Patent
Ju

(10) Patent No.: US 9,270,007 B2
(45) Date of Patent: Feb. 23, 2016

(54) POWER DIVIDER

(71) Applicant: Electronics and Telecommunications Research Institute, Daejeon (KR)

(72) Inventor: JeongHo Ju, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 254 days.

(21) Appl. No.: 13/961,964

(22) Filed: Aug. 8, 2013

(65) Prior Publication Data

US 2014/0368294 A1 Dec. 18, 2014

(30) Foreign Application Priority Data

Jun. 18, 2013 (KR) ........................ 10-2013-0069439

(51) Int. Cl.
*H03H 7/38* (2006.01)
*H01P 5/16* (2006.01)

(52) U.S. Cl.
CPC ........................................ *H01P 5/16* (2013.01)

(58) Field of Classification Search
None
See application file for complete search history.

(56) References Cited

U.S. PATENT DOCUMENTS 4,367,445 A 1/1983 Dydyk
7,764,232 B2 * 7/2010 Achour et al. ......... 343/700 MS
7,911,386 B1 * 3/2011 Itoh et al. ............... 343/700 MS
8,416,031 B2 * 4/2013 Dupuy et al. ................. 333/101
8,462,063 B2 * 6/2013 Gummalla et al. ........... 343/745
2008/0001684 A1 * 1/2008 Itoh et al. ...................... 333/124
2009/0295473 A1 * 12/2009 Dupuy et al. ............. 330/124 R
2009/0295483 A1 * 12/2009 Alidio et al. .................. 330/277
2010/0026416 A1 * 2/2010 Ryou et al. .................... 333/125
2013/0321093 A1 * 12/2013 Ueda et al. ................... 333/17.3

FOREIGN PATENT DOCUMENTS

JP 2011135232 A 7/2011
KR 1020100041248 A 4/2010
KR 1020100137772 A 12/2010

OTHER PUBLICATIONS

Ernest J. Wilkinson, "An N-Way Hybrid Power Divider," IRE Transactions on Microwave Theory and Techniques, Jan. 1960, p. 116-118, vol. 8, Issue 1.

* cited by examiner

*Primary Examiner* — Cassandra Cox
(74) *Attorney, Agent, or Firm* — William Park & Associates Ltd.

(57) ABSTRACT

A power divider for a Wilkinson power divider includes a dielectric layer arranged at a lower part of the Wilkinson power divider and composed of at least one composite material: and a first composite right/left handed (CRLH) transmission line connected in series between the transformer line and the first output line. Further, the power divider for the Wilkinson power divider includes a second CRLH transmission line connected in series between the transformer line and the second output line.

16 Claims, 6 Drawing Sheets

POWER DIVIDER

CROSS-REFERENCE TO RELATED APPLICATION(S)

The present invention claims priority of Korean Patent Application No. 10-2013-0069439, filed on Jun. 18, 2013, which is incorporated herein by reference.

FIELD OF THE INVENTION

The present invention relates to a power divider.

BACKGROUND OF THE INVENTION

As smart terminals have been rapidly propagated, a great number of RF transceivers for transmitting/receiving signals to/from the smart terminals have been installed, and various methods for amplifying or dividing power in the RF transceivers have been developed.

However, to provide a configuration of a power divider, an additional band pass filter should be provided in order to improve stop band characteristics of a Wilkinson power divider, causing an increase in the volume or size of the power divider. Thus, miniaturization of the power divider is limited. Moreover, spurious harmonics generated based on a design frequency of a Wilkinson power divider may operate as noise in an adjacent channel.

SUMMARY OF THE INVENTION

An embodiment of the present invention may provide a hybrid-type power divider for dividing power at any ratio and having a band pass characteristic by applying a CRLH transmission line to a Wilkinson power divider. However, a technical object of the present invention is not limited thereto, and thus other technical objects may exist.

In accordance with a first aspect of the present invention, there is provided a power divider for a Wilkinson power divider having an input line with a certain impedance value, a transformer line connected to the input line, first and second output lines divided at the transformer line, and an isolation resistor connected between the first and second output lines. The power divider includes: a dielectric layer arranged at a lower part of the Wilkinson power divider and composed of at least one composite material; a first composite right/left handed (CRLH) transmission line connected in series between the transformer line and the first output line; and a second CRLH transmission line connected in series between the transformer line and the second output line.

In accordance with a second aspect of the present invention, there is provided a power divider for a Wilkinson power divider having an input line with a certain impedance value, a transformer line connected to the input line, first to fourth output lines divided at the transformer line, and first and second isolation resistors connected between the first to fourth output lines. The power divider includes: upper and lower dielectric layer arranged at upper and lower parts of the Wilkinson power divider and composed of at least one composite material; a first composite right/left handed (CRLH) transmission line connected in series between the transformer line and the first output line; a second CRLH transmission line connected in series between the transformer line and the second output line; a third CRLH transmission line connected in series between the transformer line and the third output line; and a fourth CRLH transmission line connected in series between the transformer line and the fourth output line.

In accordance with a third aspect of the present invention, there is provided a power divider for a Wilkinson power divider having an input line with a certain impedance value, a transformer line connected to the input line, first to fourth output lines divided at the transformer line, and first and second isolation resistors connected between the first to fourth output lines. The power divider includes: upper and lower dielectric layer arranged at upper and lower parts of the Wilkinson power divider and composed of at least one composite material; a first composite right/left handed (CRLH) transmission line connected in series between the transformer line and the first output line; a second CRLH transmission line connected in series between the transformer line and the second output line; a third CRLH transmission line connected in series between the transformer line and the third output line; and a fourth CRLH transmission line connected in series between the transformer line and the fourth output line.

In accordance with embodiments of the present invention, a power divider can be implemented as a hybrid type for adjusting a power division amount and filtering characteristics, and thus the size and volume of the device can be reduced.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

Throughout the specification and the claims, when an element is described as being "connected" to another element, this implies that the elements may be directly connected together or the elements may be connected through one or more intervening elements. Furthermore, when an element is described as "including" one or more elements, this does not exclude additional, unspecified elements, nor does it preclude the presence or addition of one or more other features, integers, steps, operations, elements, components and/or groups thereof.

Figure 1A:
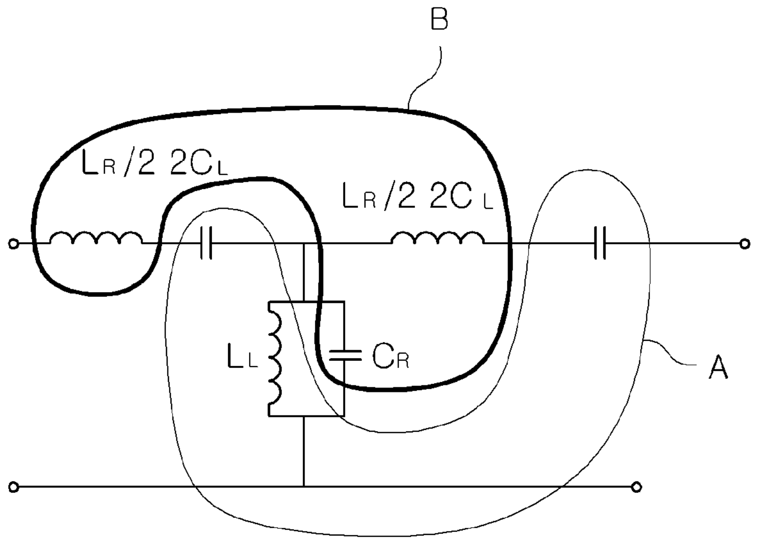
FIGS. 1A and 1B respectively show a circuit diagram illustrating a CRLH transmission line and a graph illustrating a frequency response characteristic in accordance with an embodiment of the present invention.
Figure 1B:
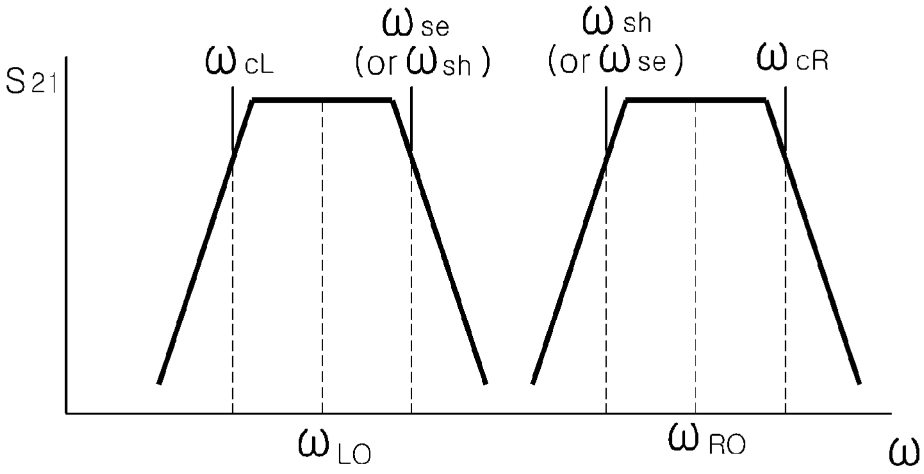

FIGS. 1A and 1B respectively show a circuit diagram illustrating a composite right/left handed (CRLH) transmission line, and a graph illustrating a frequency response characteristic in accordance with an embodiment of the present invention. FIG. 1A is a circuit diagram of the CRLH transmission line, and FIG. 1B is a graph illustrating the frequency response characteristic based on the CRLH transmission line of FIG. 1A.

Referring to FIG. 1A, the CRLH transmission line includes a left-handed (LH) transmission line A and a right-handed (RH) transmission line B. Here, the LH transmission line A includes two serial inductors $L_R/2$ and one parallel capacitor $C_R$, and the RH transmission line B includes two serial capacitors 2CL and one parallel inductor $L_L$.

The two serial inductors $L_R/2$ and one parallel capacitor $C_R$ included in the LH transmission line A operate as a band pass filter, and the two serial capacitors 2CL and one parallel inductor $L_L$ included in the RH transmission line B also operate as a band pass filter.

Referring to FIG. 1B, $\omega_{CL}$ may be a cutoff frequency generated by the serial capacitor $C_L$ and the parallel inductor $L_L$ included in the LH transmission line, and $\omega_{CR}$ may be a cutoff frequency generated by the parallel capacitor $C_R$ and the serial inductor $L_R$. $\omega_{se}$ and $\omega_{sh}$ are resonant frequencies of serial and parallel resonators respectively. In FIG. 1, $L_R$ and $C_L$ constitute the serial resonator and $L_L$ and $C_R$ constitute the parallel resonator.

$\omega_{L0}$ is a center frequency in a pass band when the LH transmission line A operates as a band pass filter, and $\omega_{R0}$ is a center frequency in a pass band when the RH transmission line B operates as a band pass filter.

Therefore, a frequency response characteristic may be achieved in any band by adjusting $\omega_{CL}$ and $\omega_{se}$ (or $\omega_{sh}$) which define a pass band of a band pass filter. That is, by adjusting $\omega_{sh}$ (or $\omega_{se}$) that indicates a cutoff frequency at a low frequency, a stop band region may be controlled.

Further, a pass band of a band pass filter may be set using $\omega_{se}$ (or $\omega_{sh}$) and $\omega_{CL}$, a stop band region may be designed using $\omega_{sh}$ (or $\omega_{se}$), and a reflection loss and an insertion loss in an operation band may be induced to have any values through Bloch impedance in a pass band. Here, a formula for calculating a lumped element in the circuit diagram of FIG. 1(A) is expressed as following equations.

$$\omega_0=\sqrt{\omega_{se}\omega_{sh}} \tag{1}$$

where $\omega_0$ denotes a center frequency, $\omega_{se}$ denotes a resonant frequency of the serial resonator, i.e. the serial capacitor and the serial inductor included in the RH transmission line B and the LH transmission line A, and $\omega_{sh}$ denotes a resonant frequency of the parallel resonator, i.e. the parallel capacitor and the parallel inductor included in the RH transmission line B and the LH transmission line A.

$$\omega_{L0}=\sqrt{\omega_{C_L}\omega_{sh}} \tag{2}$$

where $\omega_{L0}$ denotes a center frequency in a pass band of the LH transmission line A, $\omega_{CL}$ denotes a cutoff frequency generated by the serial capacitor and the parallel inductor included in the LH transmission line A, and $\omega_{sh}$ denotes a resonant frequency of the parallel resonator, i.e. the parallel capacitor and the parallel inductor included in the RH transmission line B and the LH transmission line A.

$$\omega_R = \frac{1}{Z_R C_R} \tag{3}$$

where ωR denotes a frequency determined by the RH, $Z_R$ denotes characteristic impedance determined by the RH, and $C_R$ denotes a parallel capacitor connected in parallel to the RH transmission line.

$$\omega_L = \frac{1}{Z_L C_L} \tag{4}$$

where $\omega_L$ denotes a cutoff frequency of the LH transmission line, $Z_L$ denotes characteristic impedance of the LH transmission line, and $C_L$ denotes a serial capacitor connected in series to the LH transmission line.

$$\omega_{R0}=\sqrt{\omega_{C_R}\omega_{se}} \tag{5}$$

where ωR0 denotes a center frequency of a band passed by a band pass filter, $\omega_{CR}$ denotes a cutoff frequency generated by the RH transmission line, and $\omega_{se}$ denotes a resonant frequency of the serial resonator, i.e. the serial capacitor and the serial inductor included in the RH transmission line B and the LH transmission line A.

$$\omega^4 - \left(\omega_{se}^2 + \omega_{sh}^2 + 4\left(\frac{\omega_0^2}{\omega_L}\right)^2\right)\omega^2 + \omega_0^2 = 0 \tag{6}$$

where $\omega_{se}$ denotes a resonant frequency of the serial resonator, i.e. the serial capacitor and the serial inductor included in the RH transmission line B and the LH transmission line A, $\omega_{sh}$ denotes a resonant frequency of the parallel resonator included in the RH transmission line B and the LH transmission line A, $\omega_0$ denotes a center frequency, and $\omega_L$ denotes a resonant frequency of a parallel resonator.

$$\omega_{se}^2 + \omega_{sh}^2 + 4\left(\frac{\omega_0^2}{\omega_L}\right)^2 = A \tag{7}$$

Here, by substituting Equation (6) with Equation (7), Equation (6) may be expressed as Equation (8).

$$\omega^4 - A\omega^2 + \omega_0^4 = 0 \tag{8}$$

$\omega^2$ may be obtained using a quadratic formula as expressed in Equations (9) and (10), and may be respectively defined as $\omega_{CL}^2$ and $\omega_{CR}^2$.

$$\omega_{C_L}^2 = \left|\frac{A - \sqrt{A^2 - 4\omega_0^4}}{2}\right| \tag{9}$$

$$\omega_{C_R}^2 = \left|\frac{A - \sqrt{A^2 - 4\omega_0^4}}{2}\right| \tag{10}$$

Here, A may be expressed in terms of $\omega_{CL}^2$ as expressed in Equation (11).

$$A = \frac{\omega_{C_L}^4 + \omega_0^4}{\omega_{C_L}^2} \tag{11}$$

Here, since the left-hand side of Equation (7) and the right-hand side of Equation (11), which are A, are the same, $\omega_L$ may be expressed as Equation (12) using the two equations.

$$\omega_L = \sqrt{\frac{4\omega_0^4}{\frac{\omega_{C_L} + \omega_0^4}{\omega_{C_L}^2} - \omega_{se}^2 - \omega_{sh}^2}} \tag{12}$$

Bloch impedance $Z_B$ may be expressed as Equation (13).

$$Z_B = Z_L\sqrt{\frac{\left(\frac{\omega}{\omega_{se}}\right)^2 - 1}{\left(\frac{\omega}{\omega_{sh}}\right)^2 - 1} - \left[\frac{\omega_L}{2\omega}\left\{\left(\frac{\omega}{\omega_{se}}\right)^2 - 1\right\}\right]^2} \tag{13}$$

Here, in order to calculate $Z_L$ that is characteristic impedance (Bloch impedance) by LH, at $\omega_{L0}$ that is a center frequency in the band pass filter of the LH transmission line, Equation (13) is rearranged to express $Z_L$ as expressed in Equation (14).

$$Z_L = \frac{Z_B}{\sqrt{\frac{\left(\frac{\omega_{L0}}{\omega_{se}}\right)^2 - 1}{\left(\frac{\omega}{\omega_{sh}}\right)^2 - 1} - \left[\frac{\omega_L}{2\omega_{L0}}\left\{\left(\frac{\omega_{L0}}{\omega_{se}}\right)^2 - 1\right\}\right]^2}} \tag{14}$$

Therefore, when $\omega_{CL}$ that is a cutoff frequency generated by the serial capacitor and the parallel inductor of the LH transmission line A, $Z_B$ that is Bloch impedance, $\omega_{se}$ that is a resonant frequency of a serial resonator, and $\omega_{sh}$ that is a parallel resonant frequency are defined, respective values of the elements of FIG. 1(A) may be obtained through Equations (15) to (18) as below.

$$C_L = \frac{1}{\omega_L Z_L} \tag{15}$$

Since $Z_L$ may be obtained through Equation (14) and $\omega_L$ may be calculated through Equation (12), a value of $C_L$ that is the capacitor of the LH transmission line A may be obtained through Equation (15).

$$L_R = \frac{1}{\omega_{se}^2 C_L} \tag{16}$$

Here, since the value of $C_L$ is calculated through Equation (15) and $\omega_{se}$ is a defined value, a value of $L_R$ that is the serial inductor of the RH transmission line B may be calculated through Equation (16).

$$L_L = Z_L^2 C_L \tag{17}$$

Here, since the value of $C_L$ is calculated through Equation (15) and $Z_L$ is obtained through Equation (14), $L_L$ may be calculated through Equation (17).

$$C_R = \frac{1}{\omega_{sh}^2 L_L} \tag{18}$$

Here, since $\omega_{sh}$ is a defined value and $L_L$ is obtained through Equation (17), a value of $C_R$ that is the parallel capacitor of the RH transmission line B may be calculated through Equation (18).

In the case of configuring a power divider based on the CRLH transmission line in accordance with the embodiment of the present invention, the power divider may be implemented as a hybrid-type power divider having filtering characteristics of a band pass filter and operating as a power divider. Further, an operating frequency band and a power dividing amount may be controlled by adjusting a bandwidth and characteristic impedance of a transmission line having a band pass characteristic.

Figure 2:
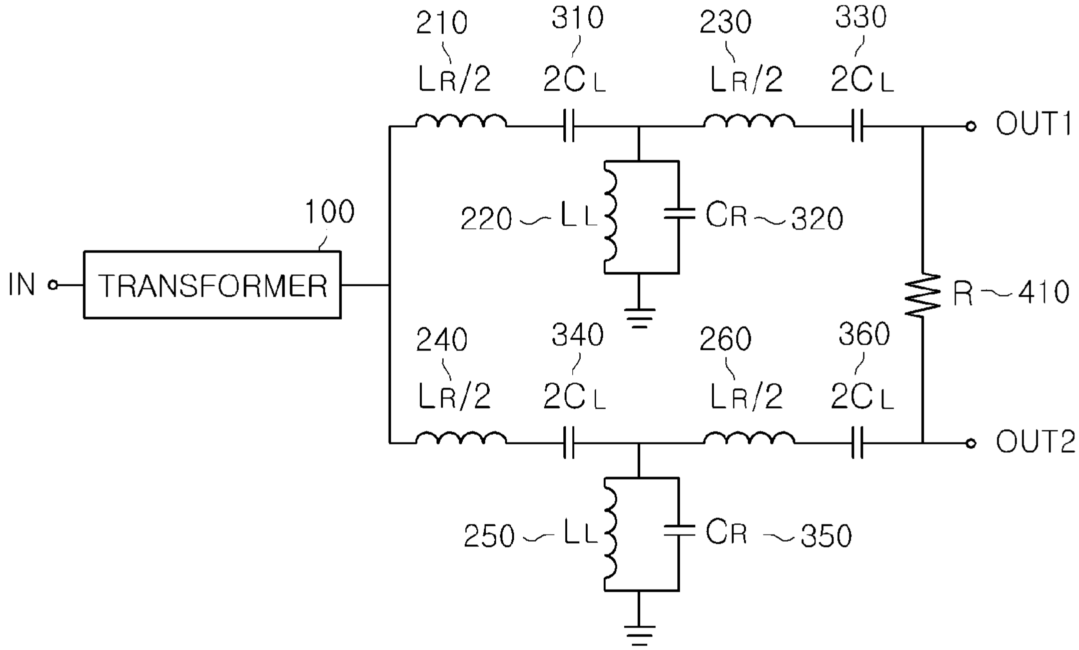
FIG. 2 is a circuit diagram illustrating a power divider in accordance with an embodiment of the present invention.
Figure 3:
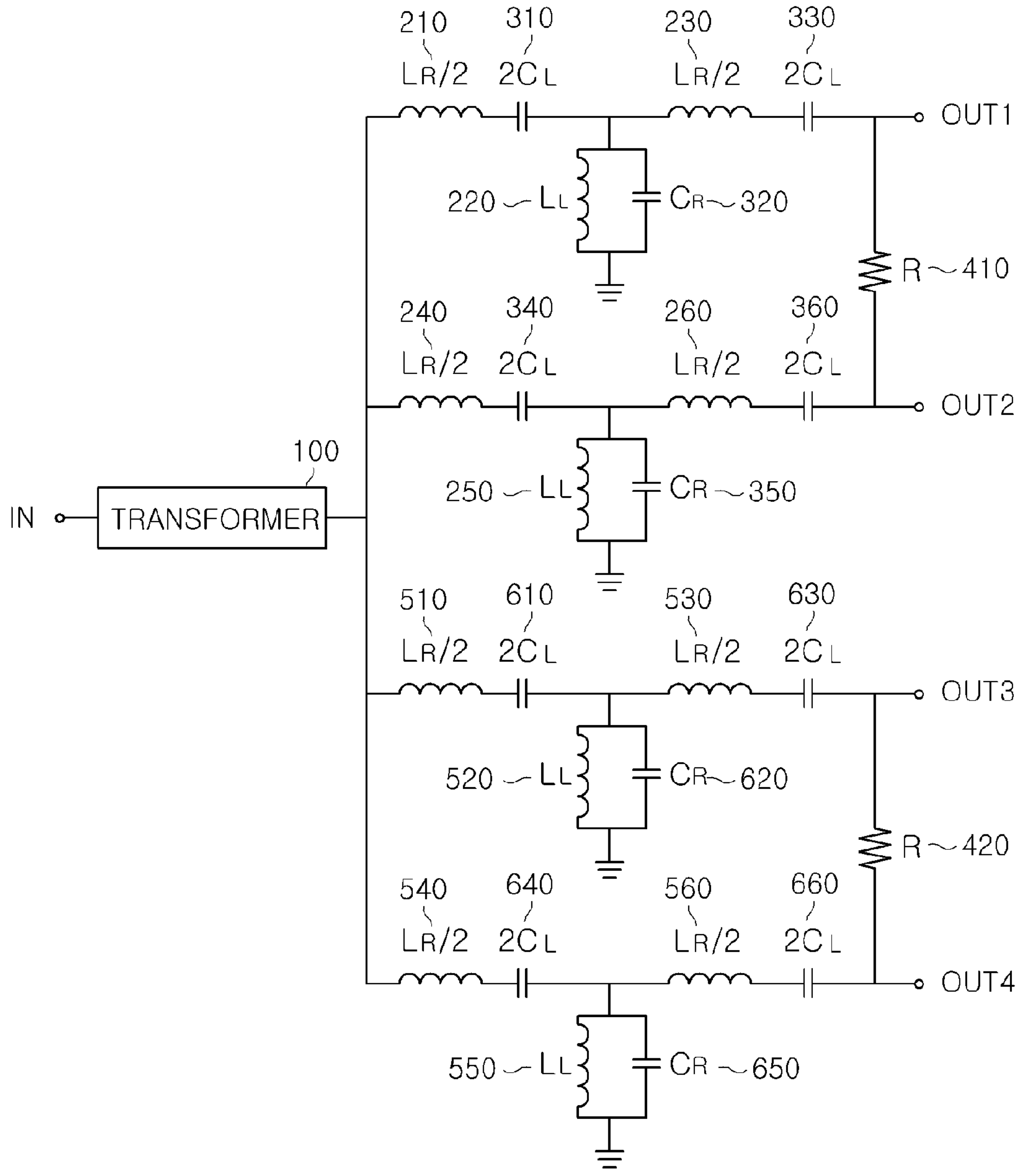
FIG. 3 is a circuit diagram illustrating another example of the power divider of FIG. 2.
Figure 4:
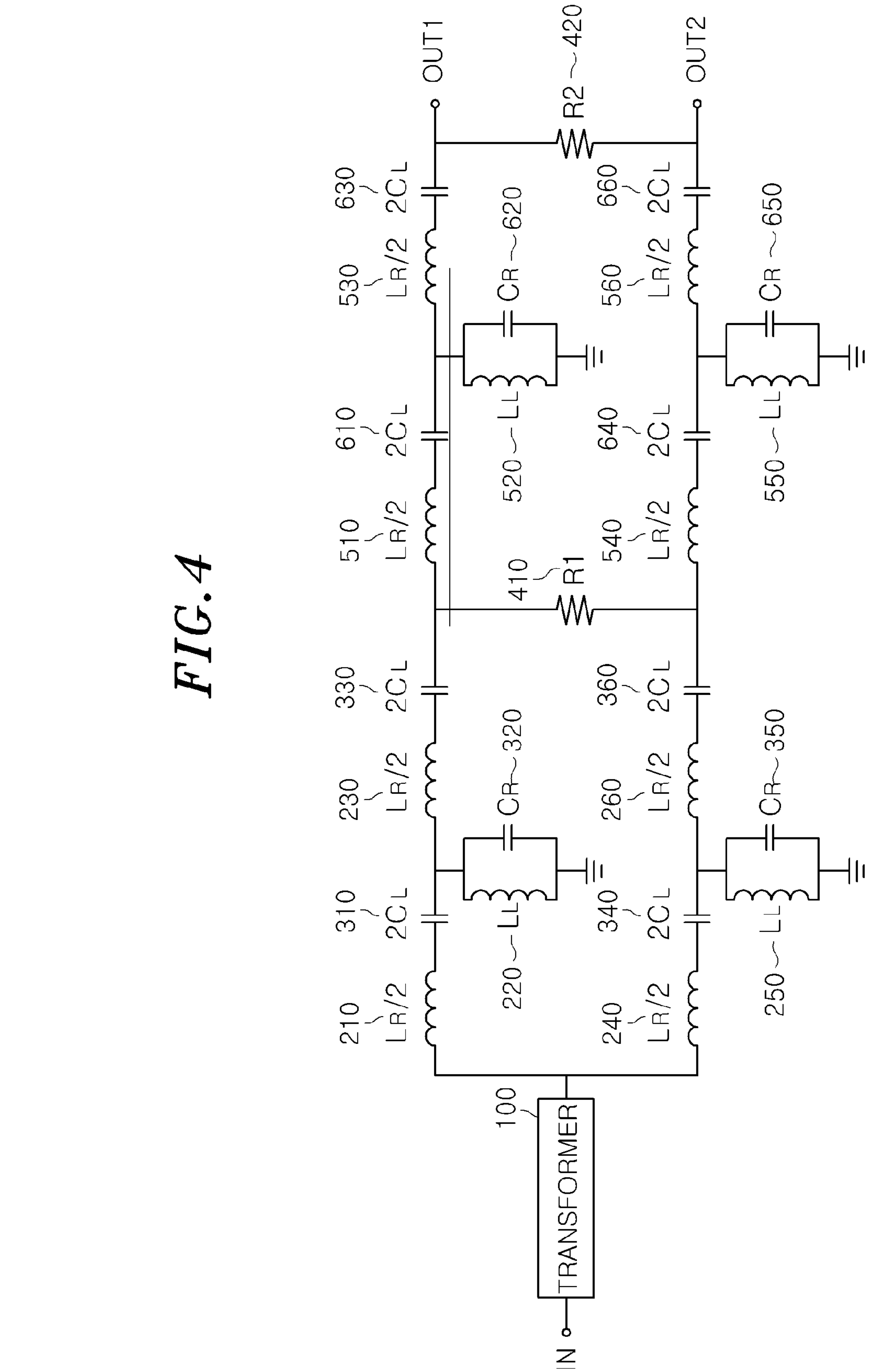
FIG. 4 is a circuit diagram illustrating still another example of the power divider of FIG. 2.

FIG. 2 is a circuit diagram illustrating a power divider in accordance with an embodiment of the present invention, FIG. 3 is a circuit diagram illustrating another example of the power divider of FIG. 2, and FIG. 4 is a circuit diagram illustrating another example of the power divider of FIG. 2.

Referring to FIG. 2, the power divider in accordance with the embodiment of the present invention includes a dielectric layer, a first CRLH transmission line, and a second CRLH transmission line. Here, the power divider may be based on a Wilkinson power divider.

The dielectric layer is disposed on a lower part of the Wilkinson power divider and may be composed of at least one composite material. Here, the at least one composite material may be a metamaterial, and the dielectric layer may be a microstrip or stripline.

A transformer 100 is connected to an input line. Here, for matching with an output line, a λ/4 transformer may be used as the transformer 100. Impedance of the λ/4 transformer may be $$\sqrt{\frac{50\times 20}{N}}\ \Omega$$

when the number of output lines is N and input resistance and output resistance are 50 Ω.

The first CRLH transmission line may include a first inductor 210, a first capacitor 310, a second inductor 220, a second capacitor 320, a third inductor 230, and a third capacitor 330.

A first terminal of the first inductor 210 is connected to a second terminal of the transformer 100 and a second terminal of the first inductor 210 is connected to a second terminal of the first capacitor 310. A first terminal of the first capacitor 310 is connected to the second terminal of the first inductor 210, and the second terminal of the first capacitor 310 is connected to first terminals of the second inductor 220 and second capacitor 320. Further, the second terminal of the first capacitor 310 is connected to a first terminal of the third inductor 230.

The second inductor 220 and the second capacitor 320 may be connected to each other in parallel, the first terminals of the second inductor 220 and second capacitor 320 may be connected to the second terminal of the first capacitor 310, and second terminals of the second inductor 220 and second capacitor 320 may be connected to a reference point (GND).

The first terminal of the third inductor 230 may be connected to the second terminal of the first capacitor 310 and the first terminals of the second inductor 220 and second capacitor 320, and a second terminal of the third inductor 230 may be connected to a first terminal of the third capacitor 330. The first terminal of the third capacitor 330 is connected to the second terminal of the third inductor 230, and a second terminal of the third capacitor 330 is connected to a first output line OUT1.

The second CRLH transmission line may include a fourth inductor 240, a fourth capacitor 340, a fifth inductor 250, a fifth capacitor 350, a sixth inductor 260, and a sixth capacitor 360.

A first terminal of the fourth inductor 240 is connected to the second terminal of the transformer 100 and a second terminal of the fourth inductor 210 is connected to a first terminal of the fourth capacitor 340. The first terminal of the fourth capacitor 340 may be connected to the second terminal of the fourth inductor 240, and a second terminal of the fourth capacitor 340 may be connected to first terminals of the fifth inductor 250 and fifth capacitor 350. Here, the second terminal of the fourth capacitor 340 is also connected to a first terminal of the sixth inductor 260.

The fifth inductor 250 and the fifth capacitor 350 may be connected to each other in parallel, the first terminals of the fifth inductor 250 and fifth capacitor 350 may be connected to the second terminal of the fourth capacitor 340, and second terminals of the fifth inductor 250 and fifth capacitor 350 may be connected to the reference point.

The first terminal of the sixth inductor 260 is connected to the second terminal of the fourth capacitor 340 and the first terminals of the fifth inductor 250 and fifth capacitor 350, and a second terminal of the sixth inductor 260 is connected to a first terminal of the sixth capacitor 360. The first terminal of the sixth capacitor 360 is connected to the second terminal of the sixth inductor 260, and a second terminal of the sixth capacitor 360 is connected to a second output line OUT2.

A first terminal of an isolation resistor 410 may be connected between the second terminal of the third capacitor 330 and the first output line OUT1, and a second terminal of the isolation resistor 410 may be connected between the second terminal of the sixth capacitor 360 and the second output line OUT2.

The power divider in accordance with the embodiment of the present invention is described below with respect to the RH transmission line and the LH transmission line.

The first CRLH transmission line is connected in series between a line of the transformer 100 and the first output line OUT1. Here, the first CRLH transmission line may be an equivalent of a combination of the RH transmission line and the LH transmission line.

The RH transmission line may include the two serial inductors 210 and 230 and the parallel capacitor 320, and the LH transmission line may include the two serial capacitors 310 and 330 and the parallel inductor 220.

Here, values of the serial capacitors 310 and 330 included in the LH transmission line may be determined by Equation (15). Further, values of a cutoff frequency and characteristic impedance of the transmission line may be defined by Equations (12) and (14) respectively, and a value of the parallel inductor 220 of the LH transmission line may be determined by Equation (17).

Values of the serial inductors 210 and 230 included in the RH transmission line may be determined by Equation (16), and a value of the parallel capacitor 320 included in the RH transmission line may be determined by Equation (18).

The second CRLH transmission line may be connected in series between the line of the transformer 100 and the second output line OUT2. Here, the single CRLH transmission line described above with reference to FIG. 1(A) is one unit, and may be included in the power divider in accordance with the embodiment of the present invention in an amount of at least one unit. In the embodiment of FIG. 2, a single CRLH transmission line constituting a single unit is arranged for each output line. Therefore, the first CRLH transmission and the second CRLH transmission line are the same, and thus overlapping descriptions are omitted.

A division ratio of power outputted from the first and second output lines OUT1 and OUT2 may be adjusted corresponding to Bloch impedance. Here, a value of the Bloch impedance may be determined by Equation 13.

In addition, although only power divider functions have been described, the power divider in accordance with the embodiment of the present invention may also operate as a power coupler.

The power divider in accordance with the embodiment of the present invention may provide a bandwidth and power characteristics desired by a designer based on the Wilkinson power divider having a band pass characteristic. Further, since harmonics may be eliminated by using a band pass characteristic of a transmission line, power degenerated due to spurious harmonics may be minimized and a power source that operates as noise in an adjacent channel may be eliminated.

Unmentioned features of the power divider of FIG. 2 are the same as those of the power divider of FIG. 1 or may be inferred from the above description, and are thus omitted below.

Hereinafter, power dividers in accordance with other embodiments of the present invention will be described.

FIG. 3 illustrates a power divider in accordance with another embodiment of the present invention. The power divider in accordance with the another embodiment of the present invention has four outputs and has a one-stage structure.

The power divider includes a first CRLH transmission line connected in series between a line of a transformer 100 and a first output line OUT1, a second CRLH transmission line connected in series between the line of the transformer 100 and a second output line OUT2, a third CRLH transmission line connected in series between the line of the transformer 100 and a third output line OUT3, and a fourth CRLH transmission line connected in series between the line of the transformer 100 and a fourth output line OUT4.

Here, a first isolation resistor 410 may be connected between the first output line OUT1 and the second output line OUT2, and a second isolation resistor 420 may be connected between the third output line OUT3 and the fourth output line OUT4. A division ratio of power outputted from the first to fourth output lines OUT1 to OUT4 may be adjusted corresponding to Bloch impedance.

FIG. 4 illustrates a power divider in accordance with still another embodiment of the present invention. The power divider in accordance with the still another embodiment of the present invention has two outputs and has a two-stage structure.

The power divider includes a first CRLH transmission line connected in series between a line of a transformer 100 and a first isolation resistor 410, a second CRLH transmission line connected in series between the first isolation resistor 410 and a first output line OUT1, a third CRLH transmission line connected in series between the line of the transformer 100 and the first isolation resistor 410, and a fourth CRLH transmission line connected in series between the first isolation resistor 410 and a second output line OUT2.

A first terminal of the isolation resistor 410 may be connected to a second terminal of the first CRLH transmission line and a first terminal of the second CRLH transmission line, and a second terminal of the isolation resistor 410 may be connected to a second terminal of the third CRLH transmission line and a first terminal of the fourth CRLH transmission line. A first terminal of a second isolation resistor 420 may be connected between a second terminal of the second CRLH transmission line and the first output line OUT1, and a second terminal of the second isolation resistor 420 may be connected between a second terminal of the fourth CRLH transmission line and the second output line OUT2. A division ratio of power outputted from the first and second output lines OUT1 and OUT2 may be adjusted corresponding to Bloch impedance.

Since the power dividers in accordance with the embodiments of the present invention may arbitrarily adjust Bloch impedance, the power dividers may be implemented in the manner of arbitrarily designing the power division ratio. Here, in the present invention, although the Bloch impedance is similar to characteristic impedance, the term of the Bloch impedance is used only for a configuration having a periodic structure and defines unique input impedance of a periodic circuit, and the characteristic impedance is defined to be used only for a configuration such as a transmission line.

Unmentioned features of the power dividers of FIGS. 3 and 4 are the same as those of the power dividers of FIGS. 1 and 2 or may be inferred from the above description, and are thus omitted below.

Figure 5:
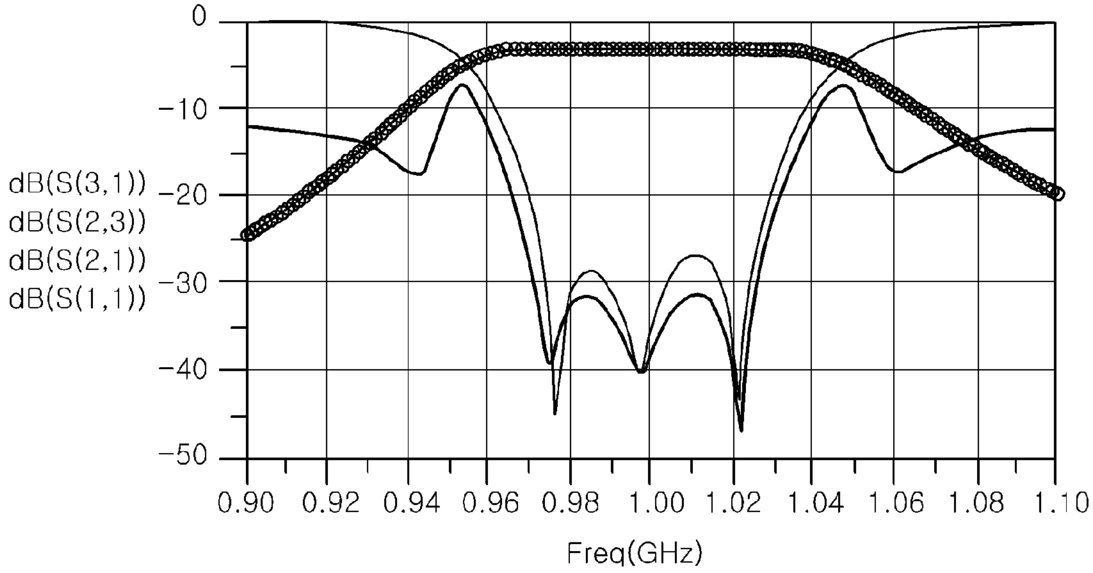
FIG. 5 is a graph illustrating a result of a simulation of an output characteristic of the power divider of FIG. 4.

FIG. 5 is a graph illustrating a result of a simulation of an output characteristic of the power divider of FIG. 4, and FIG. 6 is a graph illustrating results of simulations of output characteristics of the power dividers of FIGS. 2 and 3.

FIG. 5 is a graph illustrating the result of the simulation of the output characteristic of the power divider of FIG. 4. In the embodiment of the present invention, it is assumed that power is equally divided between the first and second output lines OUT1 and OUT2. Here, the power division ratio may be adjusted through the Bloch impedance.

In FIG. 5, it may be understood that S(2, 1) indicating a comparison between an amount of power inputted to an input line and an amount of power outputted from the first output line OUT1 is about −3 dB, i.e. the power amount becomes almost exactly half in an operation band of 0.95-1.05 GHz. Further, it may be understood that S(3, 1) indicating a comparison between the amount of power inputted to the input line and an amount of power outputted from the second output line OUT2 is about −3 dB, i.e. the power amount becomes almost exactly half.

Furthermore, it may be understood that S(1, 1) indicating a reflection coefficient is about −45 dB in the operation band, i.e. there is almost no returning power to the input line.

Figure 6A:
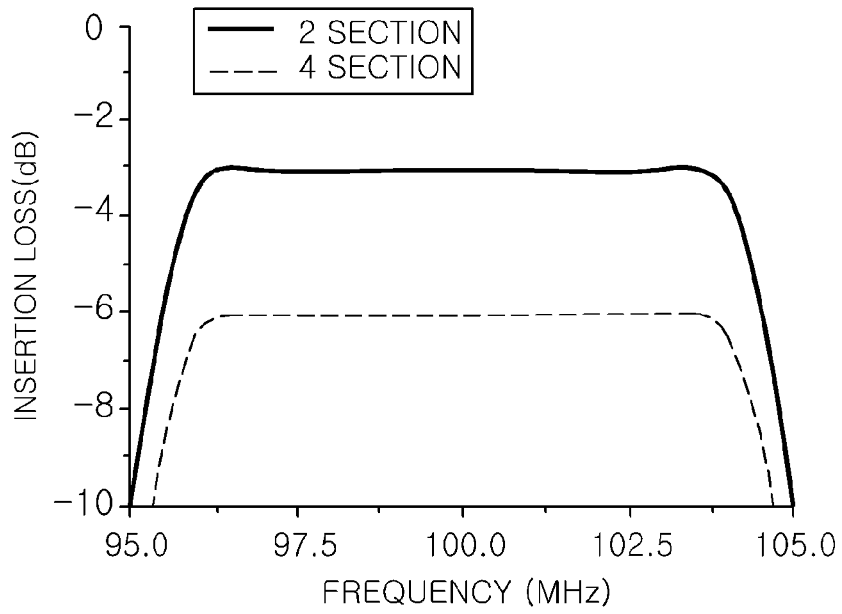
FIGS. 6A and 6B are graphs illustrating results of simulations of output characteristics of the power dividers of FIGS. 2 and 3.
Figure 6B:
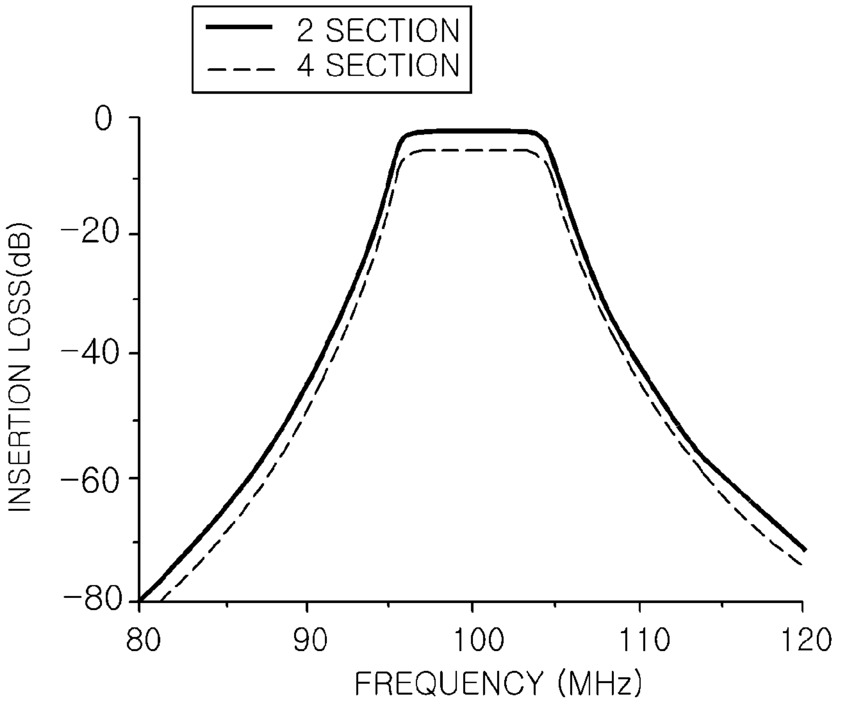

FIGS. 6A and 6B illustrate results of simulations on the power dividers of FIGS. 2 and 3 to measure a power division amount according to the number of output lines. FIG. 6A magnifies a certain part of FIG. 6B.

In an operation band of 0.95-1.05 GHz in FIG. 6A, the power divider of FIG. 2 outputs power of −3 dB, i.e. a half of power, at each output line to thereby divide power by half. The power divider of FIG. 3 outputs power of −6 dB, i.e. one fourth of power, at each output line to thereby divide power by one fourth. As illustrated in FIG. 6B, a filtering characteristic in a stop band, i.e. a skirt characteristic, has a sharp shape. Herein, the skirt characteristic may be adjusted according to the number of unit circuits of a circuit diagram.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A power divider for a Wilkinson power divider having an input line with a certain impedance value, a transformer line connected to the input line, first and second output lines divided at the transformer line, and an isolation resistor connected between the first and second output lines, the power divider comprising:

a dielectric layer arranged at a lower part of the Wilkinson power divider and composed of at least one composite material;

a first composite right/left handed (CRLH) transmission line connected in series between the transformer line and the first output line; and a second CRLH transmission line connected in series between the transformer line and the second output line, wherein a division ratio of power outputted from the first and second output lines is adjusted corresponding to Bloch impedance.

2. The power divider of claim 1, wherein the first CRLH transmission line and the second CRLH transmission line are equivalent to a combination of an RH transmission line including two serial inductors and a parallel capacitor and an LH transmission line including two serial capacitors and a parallel inductor.

3. The power divider of claim 2, wherein a value of the serial capacitor included in the LH transmission line is determined by a following equation:

$$C_L = \frac{1}{\omega_L Z_L}$$

where $C_L$ denotes the serial capacitor included in the LH transmission line, $\omega_L$ denotes a cutoff frequency of the LH transmission line, and $Z_L$ denotes characteristic impedance of the LH transmission line.

4. The power divider of claim 3, wherein the cutoff frequency and characteristic impedance of the LH transmission line are defined by following equations:

$$\omega_L = \sqrt{\frac{4\omega_0^4}{\frac{\omega_{C_L} + \omega_0^4}{\omega_{C_L}^2} - \omega_{se}^2 - \omega_{sh}^2}}$$

$$Z_L = \frac{Z_B}{\sqrt{\frac{\left(\frac{\omega_{L0}}{\omega_{se}}\right)^2 - 1}{\left(\frac{\omega}{\omega_{sh}}\right)^2 - 1} - \left[\frac{\omega_L}{2\omega_{L0}}\left\{\left(\frac{\omega_{L0}}{\omega_{se}}\right)^2 - 1\right\}\right]^2}}$$

where $\omega_0$ denotes a center frequency, $\omega_{CL}$ denotes a cutoff frequency generated by the serial capacitor and the parallel inductor included in the LH transmission line, $\omega_{se}$ and $\omega_{sh}$ denote resonant frequencies by the serial capacitor and serial inductor and the parallel capacitor and parallel inductor included in the LH transmission line and the RH transmission line respectively, $Z_B$ denotes a bloch impedance, and $\omega_{L0}$ denotes a center frequency in a pass band of the LH transmission line.

5. The power divider of claim 3, wherein a value of the parallel inductor included in the LH transmission line is determined by a following equation:

$$L_L = Z_L^2 C_L$$

where $L_L$ denotes the parallel inductor included in the LH transmission line, $Z_L$ denotes characteristic impedance of the LH transmission line, and $C_L$ denotes the serial capacitor included in the LH transmission line.

6. The power divider of claim 3, wherein a value of the serial inductor included in the RH transmission line is determined by a following equation:

$$L_R = \frac{1}{\omega_{se}^2 C_L}$$

where $L_R$ denotes the serial inductor included in the RH transmission line, $\omega_{se}$ denotes a resonant frequency by the serial capacitor and the serial inductor included in the LH transmission line and the RH transmission line, and $C_L$ denotes the serial capacitor included in the LH transmission line.

7. The power divider of claim 5, wherein a value of the parallel capacitor included in the RH transmission line is determined by a following equation:

$$C_R = \frac{1}{\omega_{sh}^2 L_L}$$

where $C_R$ denotes the parallel capacitor included in the RH transmission line, $\omega_{sh}$ denotes a resonant frequency by the parallel capacitor and the parallel inductor included in the LH transmission line and the RH transmission line, and $L_L$ denotes the parallel inductor included in the LH transmission line.

8. The power divider of claim 1, wherein the Bloch impedance is determined by a following equation:

$$Z_B = Z_L \sqrt{\frac{\left(\frac{\omega}{\omega_{se}}\right)^2 - 1}{\left(\frac{\omega}{\omega_{sh}}\right)^2 - 1} - \left[\frac{\omega_L}{2\omega}\left\{\left(\frac{\omega}{\omega_{se}}\right)^2 - 1\right\}\right]^2}$$

where $Z_B$ denotes the Bloch impedance, $\omega_{se}$ and $\omega_{sh}$ denote resonant frequencies by the serial capacitor and serial inductor and the parallel capacitor and parallel inductor included in the LH transmission line and the RH transmission line respectively, $\omega_L$ denotes a cutoff frequency of the LH transmission line, and $Z_L$ denotes characteristic impedance of the LH transmission line.

9. The power divider of claim 1, wherein the first CRLH transmission line comprises:

a first inductor having a first terminal connected to a second terminal of the transformer;

a first capacitor having a first terminal connected to a second terminal of the first inductor;

a second inductor and a second capacitor having first terminals connected to a second terminal of the first capacitor and second terminals connected to a reference point;

a third inductor having a first terminal connected to the second terminal of the first capacitor and the first terminals of the second inductor and the second capacitor; and a third capacitor having a first terminal connected to a second terminal of the third inductor and a second terminal connected to the first output line.

10. The power divider of claim 1, wherein the second CRLH transmission line comprises:

a fourth inductor having a first terminal connected to a second terminal of the transformer;

a fourth capacitor having a first terminal connected to a second terminal of the fourth inductor;

a fifth inductor and a fifth capacitor having first terminals connected to a second terminal of the fourth capacitor and second terminals connected to a reference point;

a sixth inductor having a first terminal connected to the second terminal of the fourth capacitor and the first terminals of the fifth inductor and the fifth capacitor; and a sixth capacitor having a first terminal connected to a second terminal of the fifth inductor and a second terminal connected to the second output line.

11. A power divider for a Wilkinson power divider having an input line with a certain impedance value, a transformer line connected to the input line, first to fourth output lines divided at the transformer line, a first isolation resistor connected between the first and second output lines, and a second isolation resistor connected between the third and fourth output lines, the power divider comprising:

upper and lower dielectric layer arranged at upper and lower parts of the Wilkinson power divider and composed of at least one composite material;

a first composite right/left handed (CRLH) transmission line connected in series between the transformer line and the first output line;

a second CRLH transmission line connected in series between the transformer line and the second output line;

a third CRLH transmission line connected in series between the transformer line and the third output line; and a fourth CRLH transmission line connected in series between the transformer line and the fourth output line.

12. The power divider of claim 11, wherein, the first isolation resistor is connected between the first CRLH transmission line and the second CRLH transmission line, and the second isolation resistor is connected between the third CRLH transmission line and the fourth CRLH transmission line.

13. The power divider of claim 11, wherein a division ratio of power outputted from the first to fourth output lines is adjusted corresponding to Bloch impedance.

14. A power divider for a Wilkinson power divider having an input line with a certain impedance value, a transformer line connected to the input line, first and second output lines divided at the transformer line, and first and second isolation resistors, the power divider comprising:

upper and lower dielectric layer arranged at upper and lower parts of the Wilkinson power divider and composed of at least one composite material;

a first composite right/left handed (CRLH) transmission line connected in series between the transformer line and the first isolation resistor;

a second CRLH transmission line connected in series between the first isolation resistor and the first output line;

a third CRLH transmission line connected in series between the transformer line and the first isolation resistor; and a fourth CRLH transmission line connected in series between the first isolation resistor and the second output line, wherein the first isolation resistor is connected between a connection point of the first and second CRLH transmission lines and a connection point of the third and fourth CRLH transmission lines, and the second isolation resistor is connected between the first and second output lines.

15. The power divider of claim 14, wherein, a first terminal of the first isolation resistor is connected to a second terminal of the first CRLH transmission line and a first terminal of the second CRLH transmission line, and a second terminal of the first isolation resistor is connected to a second terminal of the third CRLH transmission line and a first terminal of the fourth CRLH transmission line, and a first terminal of the second isolation resistor is connected between a second terminal of the second CRLH transmission line and the first output line, and a second terminal of the second isolation resistor is connected between a second terminal of the fourth CRLH transmission line and the second output line.

16. The power divider of claim 14, wherein a division ratio of power outputted from the first and second output lines is adjusted corresponding to Bloch impedance.

* * * * *